(12) United States Patent
Nakano

(10) Patent No.: US 6,259,346 B1
(45) Date of Patent: *Jul. 10, 2001

(54) ELECTRIC NOISE ABSORBER

(75) Inventor: Yoshihito Nakano, Yokohama (JP)

(73) Assignee: Kitagawa Industries Co., Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/217,078

(22) Filed: Mar. 24, 1994

Related U.S. Application Data

(63) Continuation of application No. 07/870,801, filed on Apr. 17, 1992, which is a continuation of application No. 07/693,691, filed on Apr. 30, 1991, which is a division of application No. 07/407,588, filed on Sep. 15, 1989, now abandoned, which is a division of application No. 07/205,578, filed on Jun. 6, 1988, now Pat. No. 4,885,559, which is a continuation of application No. 07/025,059, filed on Mar. 12, 1987, now abandoned.

(30) Foreign Application Priority Data

Aug. 29, 1986 (JP) .................................. 61-133476

(51) Int. Cl.⁷ ............................. H01F 38/20; H01F 17/06
(52) U.S. Cl. ...................... 336/175; 336/174; 336/176; 336/92; 336/90
(58) Field of Search ............................. 324/127; 174/92, 174/138 F; 333/81 R, 12, 182, 243, 183; 336/174, 175, 176, 92, 233, 229, 212, 210

(56) References Cited

U.S. PATENT DOCUMENTS

| | | |
|---|---|---|
| 3,018,455 | 1/1962 | Brandon, Jr. et al. . |
| 3,219,930 | 11/1965 | Sipler . |
| 3,229,030 | 1/1966 | Baermann . |
| 3,241,198 | 3/1966 | Baermann . |
| 3,374,434 | 3/1968 | Perry . |
| 3,462,715 | 8/1969 | Schor ................................. 333/183 |
| 3,514,731 | 5/1970 | Drake . |
| 3,684,955 | 8/1972 | Adams . |
| 4,005,380 | 1/1977 | Heilmann et al. . |
| 4,049,357 | 9/1977 | Hamisch, Jr. . |
| 4,071,824 | 1/1978 | Kernander et al. . |
| 4,263,549 | 4/1981 | Toppeto . |
| 4,336,806 | 6/1982 | Eldridge . |
| 4,426,108 | 1/1984 | Kesselmen . |
| 4,593,276 | 6/1986 | Aida et al. . |
| 4,728,919 | 3/1988 | Dirmeyer . |

FOREIGN PATENT DOCUMENTS

| | | |
|---|---|---|
| 624455 | 1/1936 | (DE) . |
| 11729 | 9/1956 | (DE) . |
| 144981 | 7/1979 | (DE) . |
| 50-27527 | 8/1975 | (JP) . |
| 129316 | 10/1979 | (JP) . |
| 55-12829 | 4/1980 | (JP) . |
| 56-3561 | 1/1981 | (JP) . |
| 56-890648 | 6/1981 | (JP) . |
| 56-106076 | 8/1981 | (JP) . |
| 57-142897 | of 1982 | (JP) . |

(List continued on next page.)

OTHER PUBLICATIONS

Japanese Abstract vol. 9, No. 131 (E–319) (1854) Jun. 6, 1985, & JP–A–60 16404 (Toshiba K.K.) Jan. 28, 1985.

Japanese Inventor Association Publication No. 83–12248 published on Nov. 21, 1983 (its abstract is enclosed herewith).

*Primary Examiner*—Anh Mai
(74) *Attorney, Agent, or Firm*—Davis & Bujold, P.L.L.C.

(57) ABSTRACT

An electric noise absorber for clamping to a cord of an electronic device comprises a holding case composed of two box-shaped case members. Each case member contains a magnet having a hemi-cylindrical groove at the upper part of the magnet for receiving the cord. It is possible to easily and securely attach and detach the electric noise absorbing magnet to the cord by simply closing and opening the case members.

20 Claims, 5 Drawing Sheets

FOREIGN PATENT DOCUMENTS

| | | |
|---|---|---|
| 57-85756 | 5/1982 | (JP) . |
| 58-51495 | 8/1983 | (JP) . |
| 61-34705 | 3/1986 | (JP) . |
| 61-38714 | 3/1986 | (JP) . |
| 61-76626 | 5/1986 | (JP) . |
| 61-97899 | 6/1986 | (JP) . |
| 61-116021 | 7/1986 | (JP) . |
| 61-129475 | 8/1986 | (JP) . |

ELECTRIC NOISE ABSORBER

This is a continuation of application Ser. No. 07/870,801 filed on Apr. 17, 1992 which is a continuation of U.S. Pat. Ser. No. 07/693,691 filed Apr. 30, 1991; which is a Divisional of U.S. Pat. Ser. No. 07/407,588 filed Sep. 15, 1989 now abandoned which is a Divisional of U.S. Pat. Ser. No. 07/205,578 filed Jun. 6, 1988 (U.S. Pat. No. 4,885,559) which is a Continuation of U.S. Pat. No. 07/025,059 filed Mar. 12, 1987 (now abandoned)

BACKGROUND OF THE INVENTION

This invention relates to an electric noise absorber for absorbing electric noise which is generated within an electronic device or which enters from the outside into the device through a cord.

As a method for absorbing such noise, it is well-known that magnetic ferrite can be attached to a cord. In this method, two pieces of half ring-shaped ferrite are simply attached by adhesive tape around the cord, therefore, the pieces are apt to easily come off from the cord. Moreover it is troublesome to attach the separate pieces to the cord or to detach the adhesive tape. Furthermore, when a conductive ferrite is employed, it may make a short circuit or may generate a contact electricity in the electronic device.

SUMMARY OF THE INVENTION

It is an object of this invention to provide an electric noise absorber in which a magnetic substance can be held securely to a cord for a long time.

It is another object of this invention to provide an absorber which can be easily attached to and detached from the cord, whenever required.

It is a further object of this invention to provide an absorber which can effectively absorb electric noise and prevent the generation and inflow of noise.

These objects and other related objects are realized by an electric noise absorber of the invention which includes: two magnetic bodies, each having a hemi-cylindrical groove for receiving the cord; and two case members for covering the cord where interlocked. Each case member contains one magnet.

BRIEF DESCRIPTION OF THE DRAWINGS

This invention is illustrated diagrammatically in the following drawings wherein.

DETAILED DESCRIPTION OF PREFERRED EMBODIMENTS

The first embodiment of this invention will be described with reference to FIGS. 1 through 13.

Figure 1:
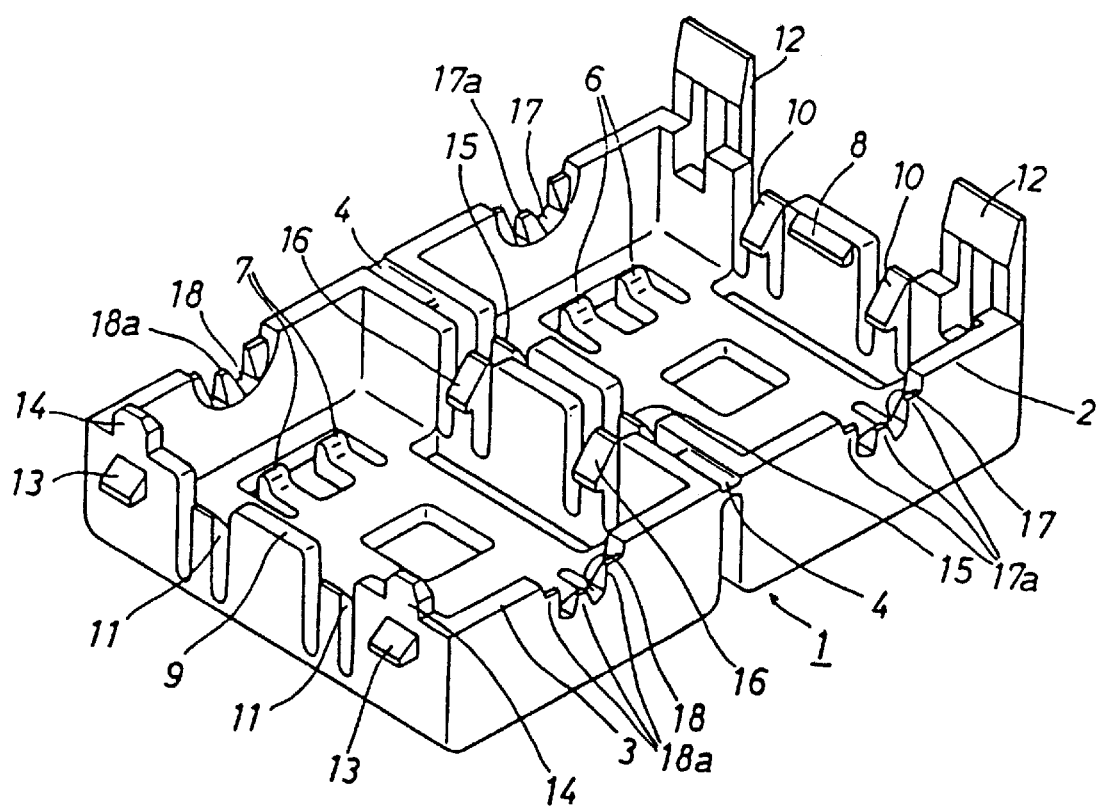
FIG. 1 is a perspective view illustrating a holding case of the first embodiment.
Figure 2:
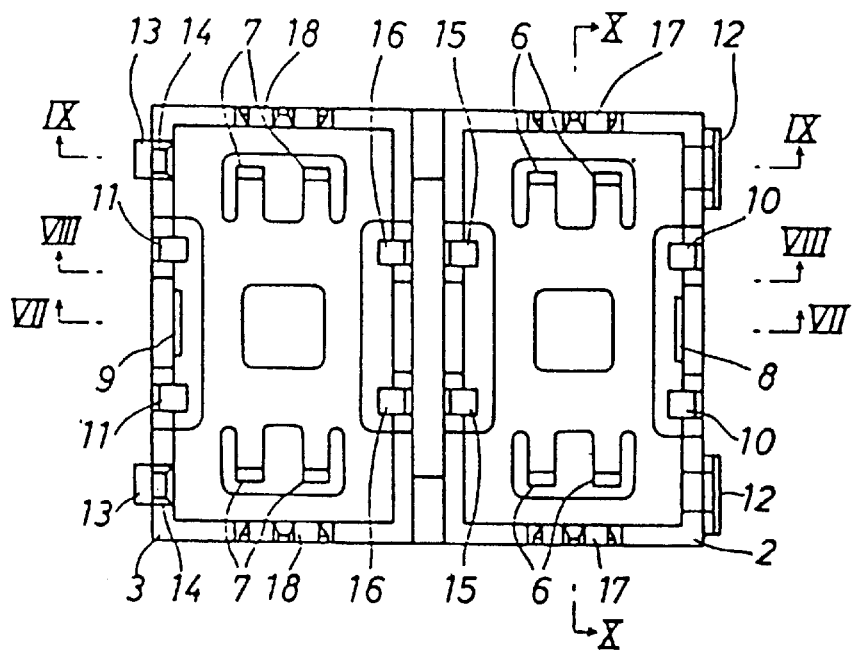
FIG. 2 is a plan view of the holding case shown in FIG. 1.
Figure 3:
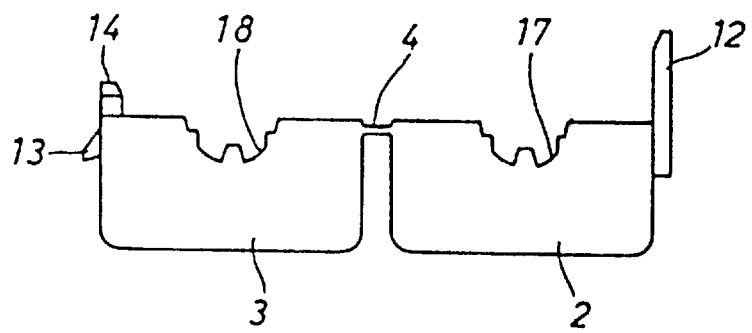
FIG. 3 is a left side view of the holding case shown in FIG. 1.
Figure 4:
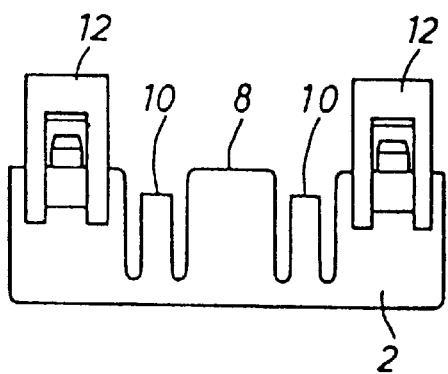
FIG. 4 is a front view of the holding case shown in FIG. 1.
Figure 5:
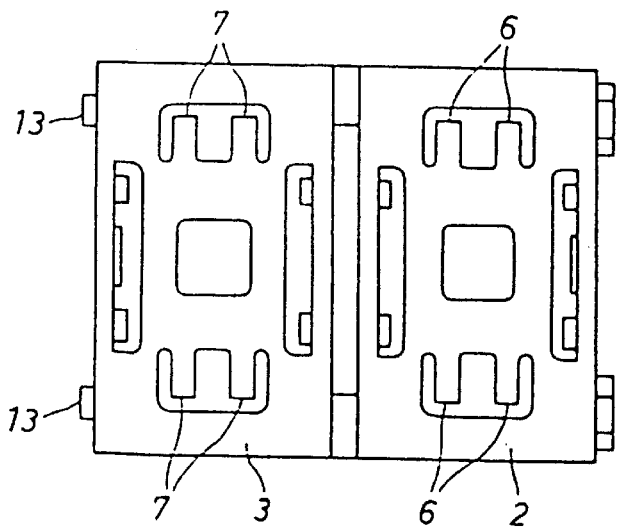
FIG. 5 is a bottom view of the holding case shown in FIG. 1.
Figure 11:
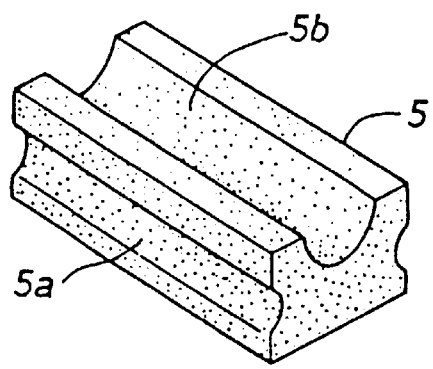
FIG. 11 is a perspective view illustrating a ferrite member.
Figure 12:
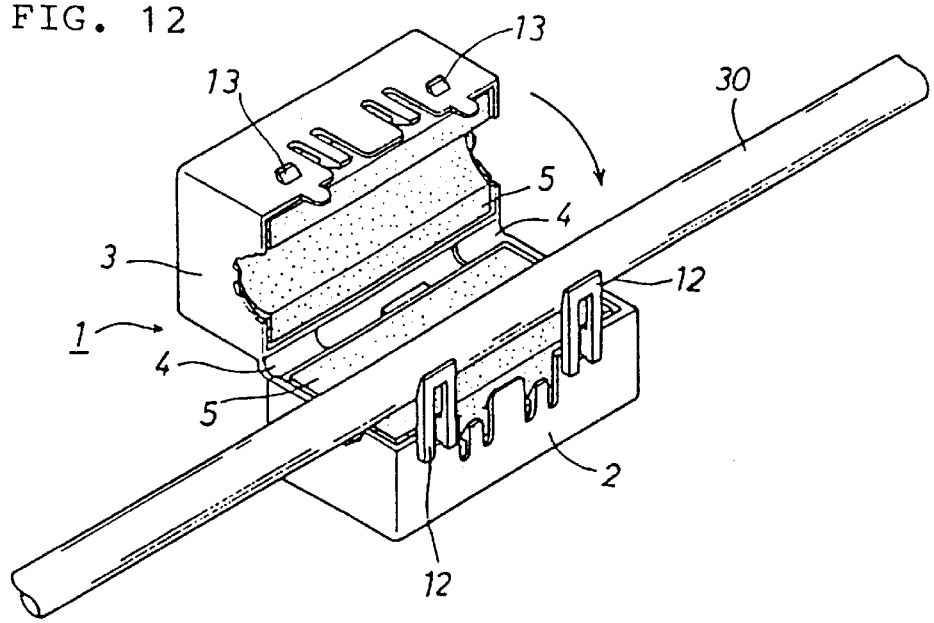
FIG. 12 is a perspective view when an electric noise absorber is attached to a cord.

FIG. 1 shows a perspective view of a holding case 1 of an electric noise absorber. The holding case 1 is composed of two case members 2 and 3 connected by means of two hinges 4. The case members 2 and 3 are box-shaped with one open surface and formed so as to securely contain a ferrite member 5 shaped as shown in FIG. 11. Four biasing members 6 and 7 project resiliently inward from the bottom of the case members 2 and 3 for biasing the ferrite member 5. Wide fixing members 8 and 9 are provided at the center of the front surface (the surface shown in FIGS. 4 and 6) of the case members 2 and 3 for securing an upper side of the ferrite member 5. Two pairs of flexible supporting projections 10 and 11 are formed adjacent to the fixing members 8 and 9. Within the case member 2, a pair of supporting projections 15 project inward from a surface opposite to the projections 10. Within the case member 3, a pair of supporting projections 16 projects inward from a surface opposite to the projections 11. The projections 10, 11, 15 and 16 project inward from the front surface so as to support side grooves 5a of the ferrite member 5. Moreover, long engaging tabs 12 are provided adjacent to the projections 10 of the case member 2. Engaging projections 13 and protrusions 14 are provided adjacent to the projections 11 of the case member 3. The projections 13 are engaged with the tabs 12 when the holding case 1 is closed. Substantially semi circular holes 17 having teeth 17a are formed on both side walls of the case member 2 for inserting a cord. Likewise, semi-circular holes 18 having teeth 18a are formed on both side walls of the case member 3.

As shown in FIG. 11, a hemi-cylindrical groove 5b is formed longitudinally along the upper part of the ferrite member 5 for receiving the cord. The side grooves 5a are formed on both sides of the ferrite member 5.

The holding case 1 is integrally formed of a synthetic resin, and each member, projection and tab have appropriate resilience.

Two ferrite members 5 are contained in the case members 2 and 3 of the holding case 1. In the case member 2, the upper side of the ferrite member 5 is secured by the fixing member 8. Two pairs of supporting projections 10 and 15 engage with the side grooves 5a, therefore the ferrite member 5 is securely held in the member 2. Likewise, in the case member 3, the upper side of the ferrite member 5 is secured by the fixing member 9, and two pairs of the projections 11 and 16 engage with the side grooves 5a. Thus the ferrite member 5 is securely held within the case member 3.

Figure 13:
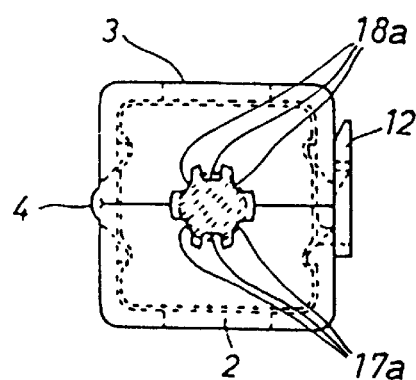
FIG. 13 is a left side view illustrating the absorber attached to the cord.

In the state that the ferrite members 5 are contained in the case members 2 and 3, a cord 30 is inserted between the case members 2 and 3, and the case member 3 covers the case member 2 so that the case 1 is attached to the cord 30 of an electronic device. The engaging projections 13 of the case member 3 are engaged with the engaging tabs 12 of the case member 2, therefore the case 1 is securely fastened. When the case 1 is closed, the biasing members 6 and 7 projecting from the bottom of the case members 2 and 3 support the ferrite members 5 so as to join them together, thereby, the ferrite members 5 are securely held. As shown in FIG. 13, the teeth 17a and 18a, around the semi-holes 17 and 18 formed on both side walls of the case members 2 and 3, are clamped against the cord 30.

By applying an appropriate number of the holding cases 1 containing the ferrite members 5 as the magnetic substance to the cord 30, noise flowing in the cord 30 is absorbed by the magnetic ferrite and generation of noise is prevented. The noise absorbing efficiency of the case 1 is measured at various positions thereof along the cord by a noise measuring device, and the position for the case where noise is absorbed most efficiently is found. It is preferable that the most appropriate number of the cases to be used are experimentally determined by measuring the noise absorbing efficiency. The ferrite members 5 absorb noise that is generated outside or enters the electronic device through the cord.

To detach the case from the cord or to change its position thereon, the engaging tabs 12 of the case member 2 are pulled outwardly so that the tabs 12 detach easily from the engaging projections 13 and the case 1 can be opened. It is possible to secure the holding case 1 to a circuit board with a double-sided adhesive tape.

Figure 6:
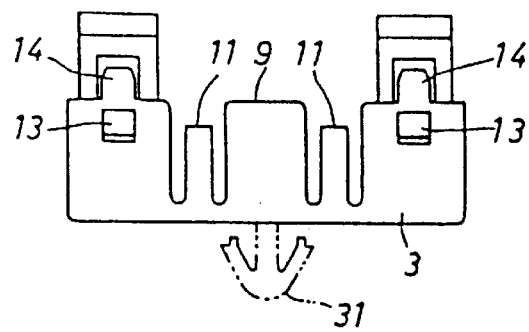
FIG. 6 is a rear view of the holding case shown in FIG. 1.
Figure 7:
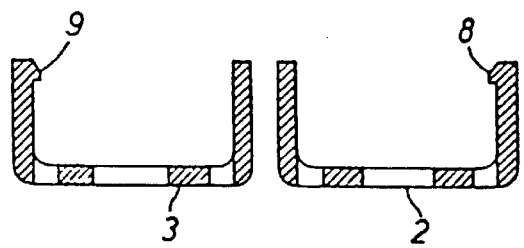
FIG. 7 is a sectional view taken along line VII—VII of FIG. 2.
Figure 8:
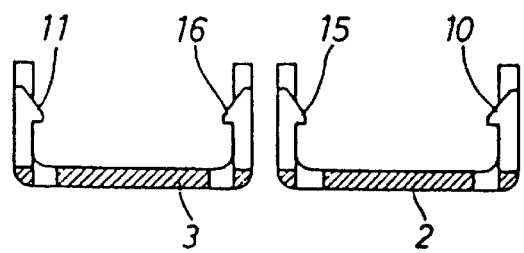
FIG. 8 is a sectional view taken along line VIII—VIII of FIG. 2.
Figure 9:
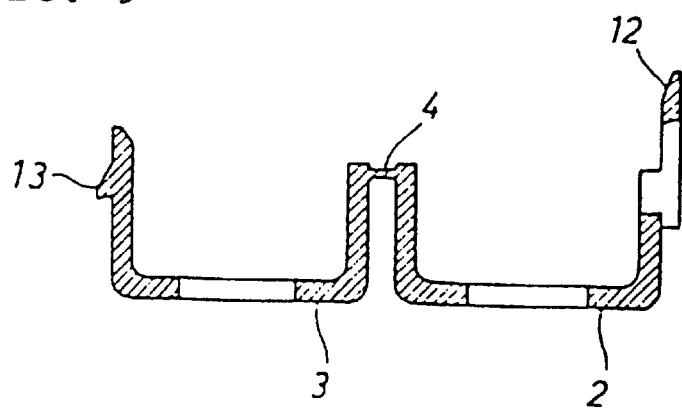
FIG. 9 is a sectional view taken along line IX—IX of FIG. 2.
Figure 10:
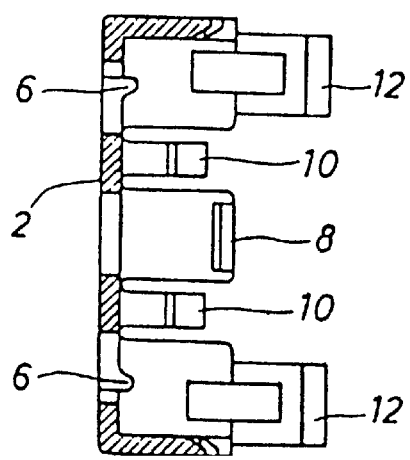
FIG. 10 is a sectional view taken along line X—X of FIG. 2.

As shown by a double-dash interrupted line in FIG. 6, a mounting leg 31 having an engaging hook may be attached to the bottom of the case member 2 or 3 so as to secure the holding case to the circuit board.

Regarding the magnetic substance, either hard or soft ferrite can be used. Further, a plastic magnet or rubber magnet which is made by mixing magnetic powder of ferrite with plastic or rubber can also be used.

Figure 14:
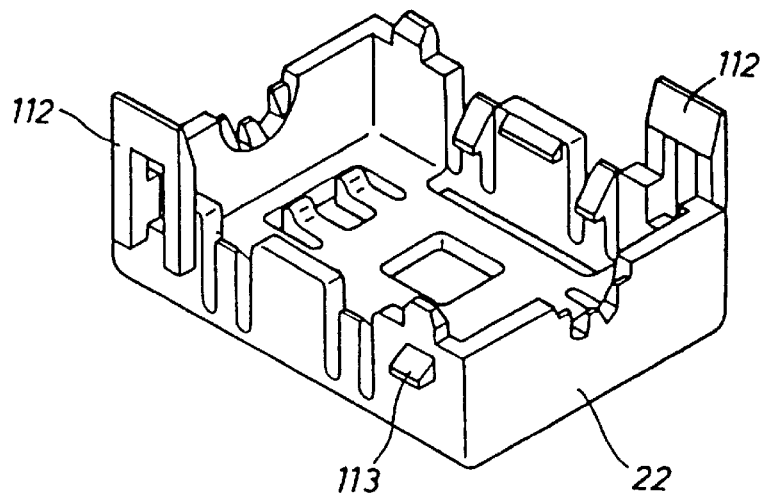
FIG. 14 is a perspective view illustrating a case member of the second embodiment.

The second embodiment of this invention is shown in FIG. 14. In this embodiment, an engaging tab 112 and a projection 113 are formed on each of the sides of a single case member 22. Another projection 113 is also provided opposite to the engaging tab 112. In order to secure the cord 30, two same case members 22 are prepared, and one ferrite member 5 is contained in each case members Then the cord 30 is held between a pair of case members 22 and the engaging tab 112 is engaged with the projection 113.

Obviously many modifications and variations of the present invention are possible in the light of the above teachings. It is therefore to be understood that within the scope of the appended claims in the invention may be practiced otherwise than as specifically described.

What is claimed is:

1. An electric noise absorber for surrounding a cord of an electronic device comprising:
   two bodies of a magnetic substance each having a hemicylindrical groove for receiving the cord;
   two case members for covering the cord when interlocked, each case member containing one said body;
   means for selectively interlocking said case members with one another such that said bodies surround said cord;
   wherein said electric noise absorber further includes resilient retaining means integrally formed in said case members during manufacture of said case members for resiliently retaining each body in its associated case member even when the case members are not interlocked; and
   each said case member has at least one biasing means, separate from said resilient retaining means, on a surface opposite to an opening for biasing said body toward the cord when said case members are closed, said biasing means being integrally formed in said case members during manufacture of said case members, said resilient retaining means and said biasing means interacting to allow the associated body to move perpendicular to said surface opposite to said opening while still being retained in said case member by said resilient retaining means; and
   said resilient retaining means allows the body to move freely relative to the associate case member while preventing the body from being inadvertently removed from the associate case member when said case members are not interlocked.

2. The electric noise absorber according to claim 1, wherein said two case members fore halves of one body and are connected by a hinge and each said case member has means for engaging the other such that said case members clamp around the cord.

3. The electric noise absorber according to claim 2 wherein:
   each said case member is box-shaped with one opening;
   the hinge is formed along a longitudinal edge of the opening;
   the engaging means are formed along another longitudinal edge of the opening;
   a hemi-hole is formed on each of opposed ends of each of said case members for passage of the cord to and from the groove; and
   teeth are formed on an edge of at least one of the hemi-holes of each opposed end for securing the cord when said case members are closed.

4. The electric noise absorber according to claim 3, wherein one of said case members has a hook projecting outside of said case member on the surface opposite to the open surface for mounting said case member.

5. The electric noise absorber according to claim 3 wherein the teeth are formed on an edge of all of the hemi-holes.

6. The electric noise absorber according to claim 3 wherein the teeth extend radially inwardly.

7. The electric noise absorber according to claim 1, wherein said two case members are formed separately and are the same as each other and said each case member has means for engaging with each other such that said case members clamp around the cord.

8. The electric noise absorber according to claim 7, wherein:
   said each case member is box-shaped with one opening;
   the engaging means are formed along a longitudinal edge of the opening;
   a hemi-hole is formed on each of opposed ends of each of said case members for passage of the cord to and from the groove; and
   teeth are formed on an edge of at least one of the hemi-holes of each opposed end for securing the cord when said case members are closed.

9. The electric noise absorber according to claim 8 wherein the teeth are formed on an edge of all of the hemi-holes.

10. The electric noise absorber according to claim 8 wherein the teeth extend radially inwardly.

11. The electric noise absorber according to claim 1, wherein one of said case members has a hook projecting outside of the case member on the surface opposite to the opening for securing said case member to a circuit board.

12. The electronic noise absorber according to claim 1, wherein said biasing means comprises a U-shaped opening integrally formed in said surface opposite said opening which defines a resilient tongue therein, a tip portion of said tongue protrudes from said opposite surface towards said opening thereby engaging and resiliently biasing said body.

13. An electrical noise absorber according to claim 1, wherein said resilient retaining means allows movement of the body perpendicular to the surface opposite said opening of that associated case member.

14. The electric noise absorber according to claim 1 wherein, when said two case members are mated with one another, the two surfaces opposite to said openings are spaced from one another a sufficient distance so that said two bodies can be accommodated therebetween and be freely movable relative to the associated case members.

15. The electric noise absorber according to claim 1, wherein the retaining means are recesses formed in each said body and detents form in each case member for engagement with the recesses.

16. The electric noise absorber according to claim 15, wherein the recesses in each said body are side grooves and the detente in said each case member are flexible projections for engagement with the side grooves.

17. The electric noise absorber according to claim 15, wherein one of said case members has a hook projecting outside of said case member on the surface opposite to the opening for mounting said case member to a circuit board.

18. An electric noise absorber for surrounding a cord of an electronic device comprising:
two bodies of a magnetic substance each having a hemi-cylindrical groove for receiving the cord, and each defining two mating surfaces spaced by said groove;
two case members for covering the cord when interlocked, each case member having two opposed end walls and at least one side wall and each said case member encasing and containing a substantial portion of one said body; and
means for selectively interlocking said case members to one another such that said bodies surround said cord;
wherein at least one resilient retaining member is integrally formed as a single piece with the case member in a sidewall of each said case member during manufacture of said case member, for resiliently retaining each body in its associated case member even when the case members are separated from one another;
each said case member has a plurality of biasing members, separate from said at least one resilient retaining member, for biasing said bodies toward each other, when said case members are closed, thereby to urge the surfaces of the two bodies into intimate contact with one another, said at least one resilient retaining member allows the bodies to move freely normal and lateral to said surfaces to accommodate action of the biasing members to achieve said intimate contact while still being retained in said case members by said resilient retaining member, said two opposed end walls and said at least one sidewall when said case members are separated from one another;
said biasing members comprises at least one U-shaped opening in a bottom surface of each case member defining a resilient tongue integrally formed as a single piece with said case member during manufacture of said case member, said tongue extends away from said bottom surface towards said body such that a tip portion of said tongue engages and resiliently biases said body; and
said at least one resilient retaining member allows the body to move freely relative to the associate case member while preventing the body from being inadvertently removed from the associate case member when said case members are not interlocked.

19. An electric noise absorber for surrounding a cord of an electronic device comprising:
two bodies of a magnetic substance each having a hemi-cylindrical groove for receiving the cord;
two case members for covering the cord when interlocked, each case member containing one said body; and
means for selectively interlocking said case members to one another such that said bodies surround said cord;
wherein at least one resilient retaining member is located in a side wall of each said case member for resiliently retaining each body in its associated case member even when the case members are not interlocked;
each said case member has a plurality of biasing members, separate from said at least one resilient retaining member, on a surface opposite to an opening for biasing said body to the cord when said case members are closed;
said biasing members comprises a U-shaped opening in said surface opposite said opening defining a resilient tongue integrally formed in said surface, a tip portion of said tongue protrudes from said opposite surface towards said opening thereby engaging and resiliently biasing said body; and
said at least one resilient retaining member allows the body to move freely relative to the associate case member while preventing the body from being inadvertently removed from the associate case member when said case members are not interlocked.

20. The electric noise absorber according to claim 19 wherein said biasing members are cantilevered leaf springs.

* * * * *